(12) United States Patent
Lim et al.

(10) Patent No.: US 8,957,431 B2
(45) Date of Patent: Feb. 17, 2015

(54) SEMICONDUCTOR LIGHT EMITTING DEVICE HAVING MULTI-CELL ARRAY

(71) Applicant: Samsung Electronics Co., Ltd., Suwon-si, Gyeonggi-do (KR)

(72) Inventors: Chan Mook Lim, Gyeonggi-do (KR); Jong Ho Lee, Gyeonggi-di (KR); Jin Hwan Kim, Gyeonggi-do (KR); Young Chul Shin, Seoul (KR); Su Hyun Jo, Seoul (KR); Jin Hyun Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/786,542

(22) Filed: Mar. 6, 2013

(65) Prior Publication Data

US 2013/0234170 A1    Sep. 12, 2013

(30) Foreign Application Priority Data

Mar. 6, 2012 (KR) .................. 10-2012-0022890
May 21, 2012 (KR) .................. 10-2012-0053550

(51) Int. Cl.
*H01L 33/00* (2010.01)
*H01L 27/15* (2006.01)
*H01L 33/38* (2010.01)

(52) U.S. Cl.
CPC .............. *H01L 27/153* (2013.01); *H01L 33/38* (2013.01)
USPC ........................................................ 257/88

(58) Field of Classification Search
CPC ..... H01L 27/15; H01L 27/153; H01L 27/156; H01L 25/0753; H01L 25/167; H01L 33/08; H01L 33/62; H01L 2251/50; H01L 2251/5353; H01L 2924/12041
USPC ............ 257/88, 93, 94, 96, 99, 103, E31.066, 257/E31.105
See application file for complete search history.

(56) References Cited

U.S. PATENT DOCUMENTS

| 7,804,098 B2 * | 9/2010 | Lee et al. | 257/88 |
| 2004/0080941 A1 * | 4/2004 | Jiang et al. | 362/252 |
| 2005/0225973 A1 * | 10/2005 | Eliashevich et al. | 362/217 |
| 2005/0254243 A1 * | 11/2005 | Jiang et al. | 362/249 |

FOREIGN PATENT DOCUMENTS

| JP | 2002-359402 | 12/2002 |
| KR | 1020090119862 | 11/2009 |
| KR | 10-0961483 | 5/2010 |
| KR | 1020100111255 | 10/2010 |
| KR | 1020110098874 | 9/2011 |
| KR | 1020110101573 | 9/2011 |
| WO | 2006/004337 | 1/2006 |

* cited by examiner

*Primary Examiner* — Brook Kebede
(74) *Attorney, Agent, or Firm* — F. Chau & Associates, LLC

(57) ABSTRACT

A semiconductor light emitting device (LED) includes a first light emitting cell having a first plurality of electrodes. A second light emitting cell includes a second plurality of electrodes. The first and second light emitting cells are disposed on the substrate and are physically separated from each other. A first interconnection unit electrically connects the first plurality of electrodes to the second plurality of the electrodes.

20 Claims, 8 Drawing Sheets

SEMICONDUCTOR LIGHT EMITTING DEVICE HAVING MULTI-CELL ARRAY

CROSS-REFERENCE TO RELATED APPLICATIONS

This application claims priority under 35 U.S.C. §119 to Korean Patent Application Nos. 10-2012-0022890 filed on Mar. 6, 2012 and 10-2012-0053550 filed on May 21, 2012, in the Korean Intellectual Property Office, the disclosures of which are incorporated by reference herein in its entirety.

TECHNICAL FIELD

The present invention relates to a semiconductor light emitting device, and more particularly, to a semiconductor light emitting device having a structure in which a plurality of light emitting cells are arranged.

DISCUSSION OF RELATED ART

Semiconductor light emitting diodes (LEDs) emit light arising from electron-hole recombination occurring at p-n junctions of p-type and n-type semiconductors. Compared to conventional light sources such as incandescent and filament, LEDs are able to provide light more efficiently, at low voltage and low current.

SUMMARY OF THE INVENTION

According to an exemplary embodiment of the inventive concept, a semiconductor light emitting device include a multi-cell array including a plurality of light emitting cells disposed on a substrate. Light emitting cells are physically separated from each other. Each of the plurality of light emitting cells has a first semiconductor layer having a first conductivity type impurity, an active layer, and a second semiconductor layer having a second conductivity type impurity. The first conductivity type impurity has a polarity opposite to that of the second conductivity type impurity. First electrodes and second electrodes are disposed on each of the light emitting cells. Interconnection units connect a plurality of first electrodes disposed on a light emitting cell to a plurality of second electrodes disposed on a neighboring light emitting cell in series.

According to an exemplary embodiment of the inventive concept, a semiconductor light emitting device includes a first light emitting cell having a first plurality of electrodes. A second light emitting cell includes a second plurality of electrodes. The first and second light emitting cells are disposed on the substrate and are physically separated from each other. A first interconnection unit electrically connects the first plurality of electrodes to the second plurality of the electrodes.

According to an exemplary embodiment of the inventive concept, a semiconductor LED includes a multi-cell array including a plurality of light emitting cells disposed on a substrate. The light emitting cells are physically separated from each other. Each of the light emitting cells has a first semiconductor layer having a first conductivity type impurity, an active layer, and a second semiconductor layer having a second conductivity type impurity. The first conductivity type impurity has a polarity opposite to that of the second conductivity type impurity. First electrodes are disposed on the first semiconductor layer of the light emitting cells. Second electrodes are disposed on the second semiconductor layer of the light emitting cells. A first connecting unit connects the first electrodes. A second connecting unit connects the second electrodes. Interconnecting units connects the light emitting cells in daisy chain connection. Each of the interconnecting units connects two adjacent light emitting cells of the light emitting cells. Each of the interconnecting units connects the first connecting unit disposed on one of the two adjacent light emitting cells and the second connecting unit disposed on other of the two adjacent light emitting cells.

According to an exemplary embodiment of the inventive concept, a semiconductor LED includes light emitting cells. The light emitting cells are physically separated from each other. The light emitting cells are electrically connected to each other in a daisy chain connection. Each of the light emitting cells includes an active layer for emitting light. A first bonding pad is disposed on a first light emitting cell of the plurality of light emitting cells. The first light emitting cell is disposed at one end of the daisy chain connection. A second bonding pad is disposed on a last light emitting cell of the plurality of light emitting cells. The last light emitting cell is disposed at other end of the daisy chain connection. A first connection unit is disposed on the first light emitting cell and is connected to the first bonding pad. A second connection unit is disposed on the last light emitting cell and is connected to the second bonding pad.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
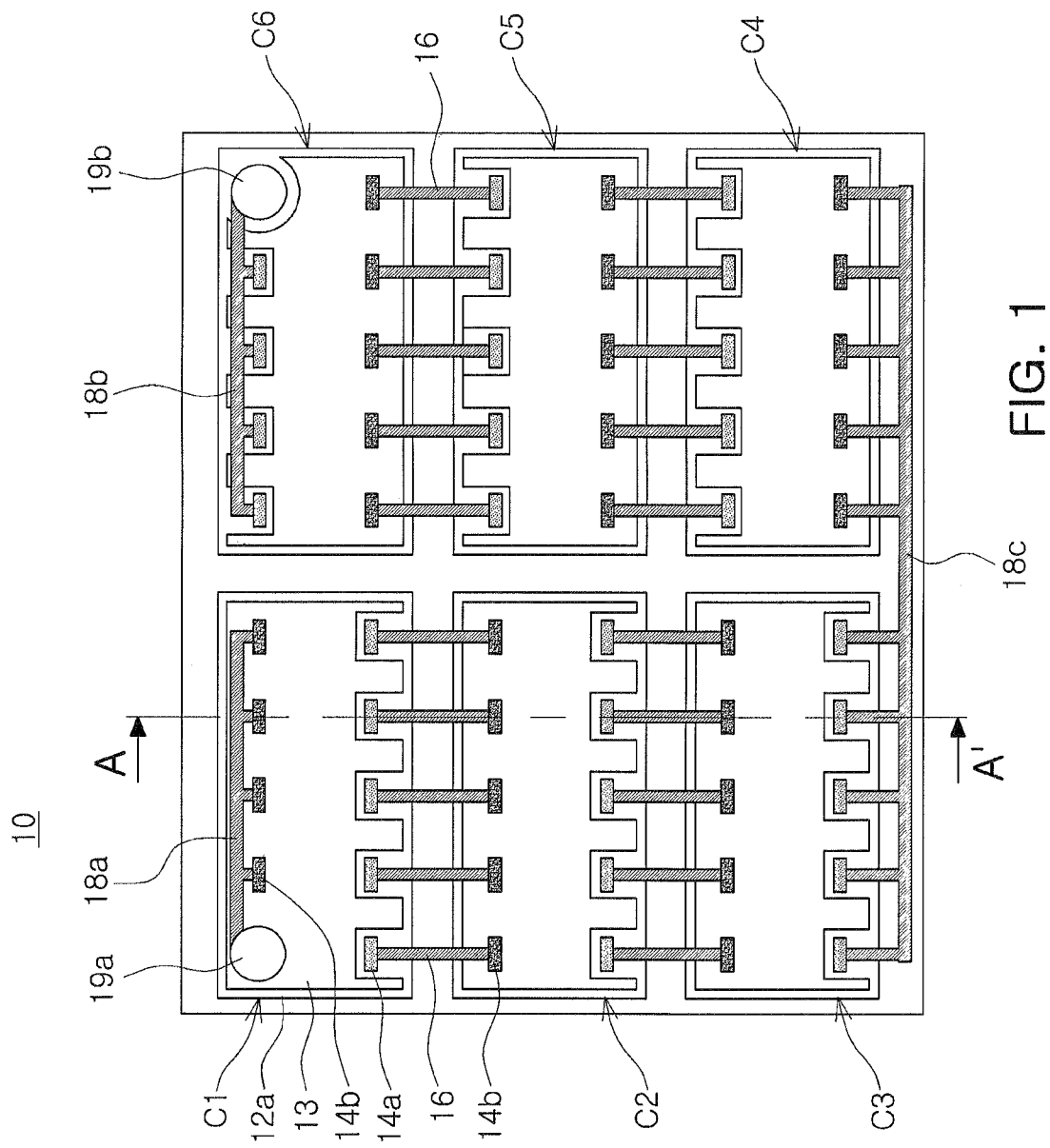
FIG. 1 illustrates a semiconductor light emitting device having a multi-cell array according to an exemplary embodiment of the inventive concept.

Exemplary embodiments of the inventive concept will be described below in more detail with reference to the accompanying drawings. However, the inventive concept may be embodied in different forms and should not be construed as limited to the embodiments set forth herein. Rather, these exemplary embodiments are provided so that this disclosure will be thorough and complete and will fully convey the inventive concept to those skilled in the art. In the drawings, the thickness of layers and regions may be exaggerated for clarity. Like reference numerals may refer to the like elements throughout the specification and drawings.

Hereinafter, a semiconductor light emitting device according to an exemplary embodiment of the inventive concept will be described with reference to FIGS. 1 to 3.

FIG. 1 illustrates a semiconductor light emitting device having a multi-cell array according to an embodiment of the present invention. FIG. 2 is an equivalent circuit diagram of the multi-cell array embodied in the semiconductor light emitting device of FIG. 1. FIG. 3 is a cross-sectional view taken along line A-A' illustrating a connection between cells in the semiconductor light emitting device of FIG. 1.

As shown in FIG. 1, a semiconductor light emitting device 10 may include a substrate 11 and six light emitting cells C1 to C6 which are arranged in two columns on an upper surface of the substrate 11. The number of light emitting cells is not limited thereto, but any number of light emitting cells may be used. Similarly, the number of columns is not limited thereto, but any number of columns may be used.

The term "light emitting cell" indicates to a multi-layered semiconductor including a single active layer that emits light arising from electron-hole recombination. For example, each of light emitting cells includes a single active layer which is physically separated from each other.

Figure 3:
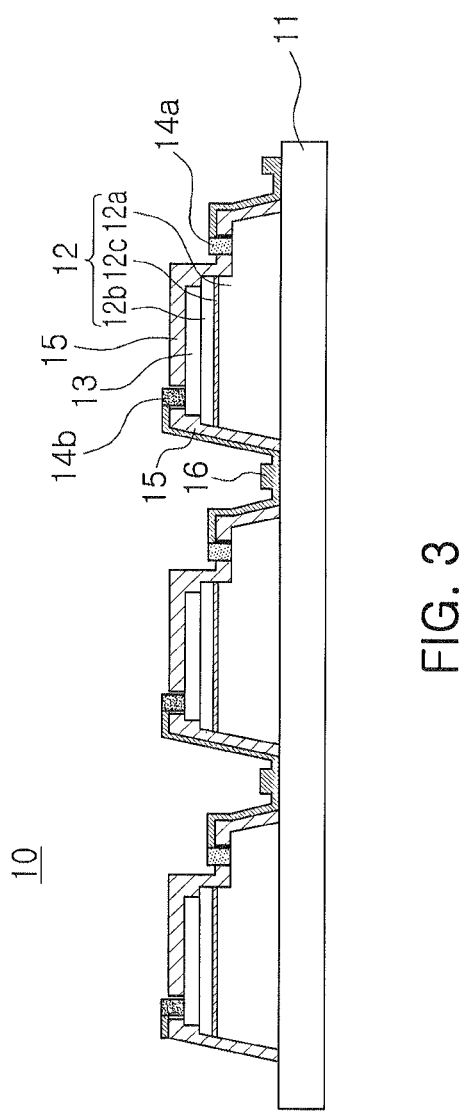
FIG. 3 is a cross-sectional view taken along line A-A' illustrating a connection between cells in the semiconductor light emitting device of FIG. 1.

As shown in FIG. 3, the semiconductor light emitting device includes six light emitting cells C1 to C6. The light emitting cells C1 to C6 each may include a first semiconductor layer 12a having a first conductivity type impurity, an active layer 12c and a second semiconductor layer 12b having a second conductivity type impurity. The first semiconductor layer 12a is formed on the substrate 11. The active layer 12c is formed on the first semiconductor layer 12a. The second semiconductor layer 12b is formed on the active layer 12c. For example, the layers 12a to 12c are sequentially formed on the upper surface of the substrate 11. For example, the first conductivity type impurity may be an n-type impurity and has a polarity. The second conductivity type impurity may be a p-type impurity and has an opposite polarity to that of the first conductivity type impurity.

The light emitting cells C1 to C6 may be formed by a full division process according to an exemplary embodiment. In the full division process, preliminary multilayer semiconductor films (not shown) are formed on the substrate 11. Portions of the preliminary multilayer semiconductor films are removed to expose the upper surface of the substrate 11. The preliminary multilayer semiconductor films physically separated constitute the multilayer semiconductor films 12.

The first semiconductor layer 12a may have an exposed flat portion through a mesa-etching process. As shown in FIG. 3, each light emitting cells C may have the flat portion partially exposed by a mesa etching process.

A transparent electrode 13 may be disposed on an upper surface of the second semiconductor layer 12b. For example, the transparent electrode 13 may include a transparent conductive material such as ITO (Indium tin oxide) and/or ZnO (Zinc oxide).

Each of the light emitting cells C1 to C6 may include a first plurality of electrodes 14a and a second plurality of electrodes 14b. The first plurality of electrodes 14a is formed on the exposed portion of the first semiconductor layer 12a. The second plurality of electrodes 14b is formed on the transparent electrode 13.

According to an exemplary embodiment, to facilitate current spreading, each light emitting cell includes the first and second plurality of electrodes 14a and 14b arranged in a longitudinal direction. For example, the first plurality of electrodes 14a formed on each of the light emitting cells C1 to C6 is arranged linearly at regular intervals on the first semiconductor layer 12a. The second plurality of electrodes 14b formed in each light emitting cell 12 is arranged linearly at regular intervals on the transparent electrode 13. The first plurality of electrodes 14a is arranged in opposite to the second plurality of electrodes 14b.

The light emitting cells C1 to C6 may be connected to each other in a daisy chain connection. For example, the light emitting cells C1 to C6 are connected sequentially from a first light emitting cell C1 to a last light emitting cell C6, which is equivalent of a circuit as shown in FIG. 2. In FIG. 2, the daisy chain connection of the light emitting cells C1 to C6 are shown in a series connection.

For the daisy chain connection, a plurality of interconnection units 16 may connect two neighboring light emitting cells. For example, as shown in FIG. 3, an interconnection unit 16 connects a first plurality of electrodes 14a of a light emitting cell C1 to a second plurality of electrodes 14b of another light emitting cell C2. The first plurality of electrodes 14a of the light emitting cell C1 is electrically connected to a first semiconductor layer 12a of a first conductivity type impurity. The second plurality of electrodes 14b of another light emitting cell C2 is electrically connected to a second semiconductor layer 12b of a second conductivity type impurity. In a similar way, two neighboring light emitting cells C2 and C3 are connected through an interconnection unit 16.

For example, as shown in FIGS. 1 and 3, the plurality of interconnection units 16 are connected to the corresponding plurality of electrodes having opposite polarities of the neighboring light emitting cells.

For example, as shown in FIG. 1, the first electrodes 14a of the light emitting cell C1 are connected to the second electrodes 14b of the neighboring light emitting cell C2 using the plurality of interconnection units 16. For the daisy chain connection, each of the light emitting cells C1 to C6 includes two rows of electrodes, respectively, formed in opposite side of the light emitting cell. The light emitting cells are arranged in a column so that two opposite polarities of neighboring light emitting cells are close to each other.

An insulating layer 15 is disposed on the surfaces of the light emitting cells to prevent the interconnection units 16 from making contact with undesired regions of the light emitting cells. The insulating layer 15 may serve as a passivation layer covering almost the entirety of the individual light emitting cells. In FIG. 1, the insulating layer 15 is omitted to clearly depict the positional relationships of the plurality of electrodes, the interconnection units, and the transparent electrodes in the light emitting cells.

First and second boding pads 19a and 19b are positioned on the first and the last light emitting cells C1 and C6, respectively. For example, the first bonding pad 19a is formed on the first light emitting cell C1 of the daisy chain connection, and the second bonding pad 19b is formed on the last light emitting cell C6 of the daisy chain connection. The light emitting cells C1 and C6, positioned at upper side of the multi-cell array where the light emitting cells are connected to each other in a daisy chain connection, are provided with first and second bonding pads 19a and 19b, respectively, so as to be connected to the electrodes having corresponding polarities.

For example, the light emitting cells C1 and C6 are positioned at the upper side of the multi-cell array. The light emitting cells C1 and C6 are connected to the first and second bonding pads 19a and 19b through first and second connection units 18a and 18b, respectively.

As shown in FIG. 1, the first bonding pad 19a and the second bonding pad 19b, respectively, are formed at one end and other end of the daisy chain connection. For example, the first bonding pad 19a is disposed on the first light emitting cell C1. The second bonding pad 19b is disposed on the last light emitting cell C6. The first bonding pad 19a is connected to an electrode of an upper row of electrodes in the first light emitting cell C1. The first bonding pad 19a and the upper row of electrodes are connected to each other through a first connection unit 18a.

In a similar way, the second bonding pad 19b is connected to the last light emitting cell C6. For example, the second bonding pad 19b is connected to an electrode of an upper row of electrodes in the last light emitting cell C6. The second bonding pad 19b and the upper row of electrodes are connected to each other through the second connection unit 18b.

The bonding pads 19a and 19b, respectively, are formed on the light emitting cells C1 and C6 without an intervening electrode underneath. Alternatively, the light emitting cells C1 and C6 may include two rows of electrodes disposed in opposite sides of each of the light emitting cells C1 and C6. In such case, the bonding pads 19a and 19b may be formed on one of an upper row of the electrodes.

Here, the first and second bonding pads 19a and 19b may be formed of metals different from those of the first and second connection units 18a and 18b and the interconnection units 16. For example, the first and second bonding pads 19a and 19b may include chromium (Cr), gold (Au), and/or an alloy thereof. The first and second connection units 18a and 18b and the interconnection units 16 for wiring connection may include metals having higher reflectivity and conductivity than metals of the first and second bonding pads. For example, the first and second connection units 18a and 18b and the interconnection units 16 may include Al and/or Ag.

Alternatively, the first and second bonding pads 19a and 19b, the first and second connection units 18a and 18b and the interconnection units 16 may include a single metal pattern formation process.

For example, the first and second bonding pads 19a and 19b, the first and second connection units 18a and 18b and the interconnection units 16 may include a common metal. For example, the common metal may include chromium (Cr), gold (Au), and/or an alloy thereof.

The light emitting cells C3 and C4, positioned at ends of individual columns of the multi-cell array among the plurality of light emitting cells C1 to C6, are connected to each other by a third connection unit 18C connecting the interconnection units 16 of the light emitting cell C3 to the interconnection units 16 of the light emitting cell C4 in a row direction.

In this manner, current, which are externally supplied and flows from the first bonding pad 19a to the second bonding pad 19b, spreads uniformly when a plurality of electrodes are formed in the individual light emitting cells. Therefore, the light emitting device 10 has increased light emitting efficiency and increased reliability.

Hereinafter, a semiconductor light emitting device according to an exemplary embodiment of the inventive concept will be described with reference to FIGS. 4 to 5.

Figure 4:
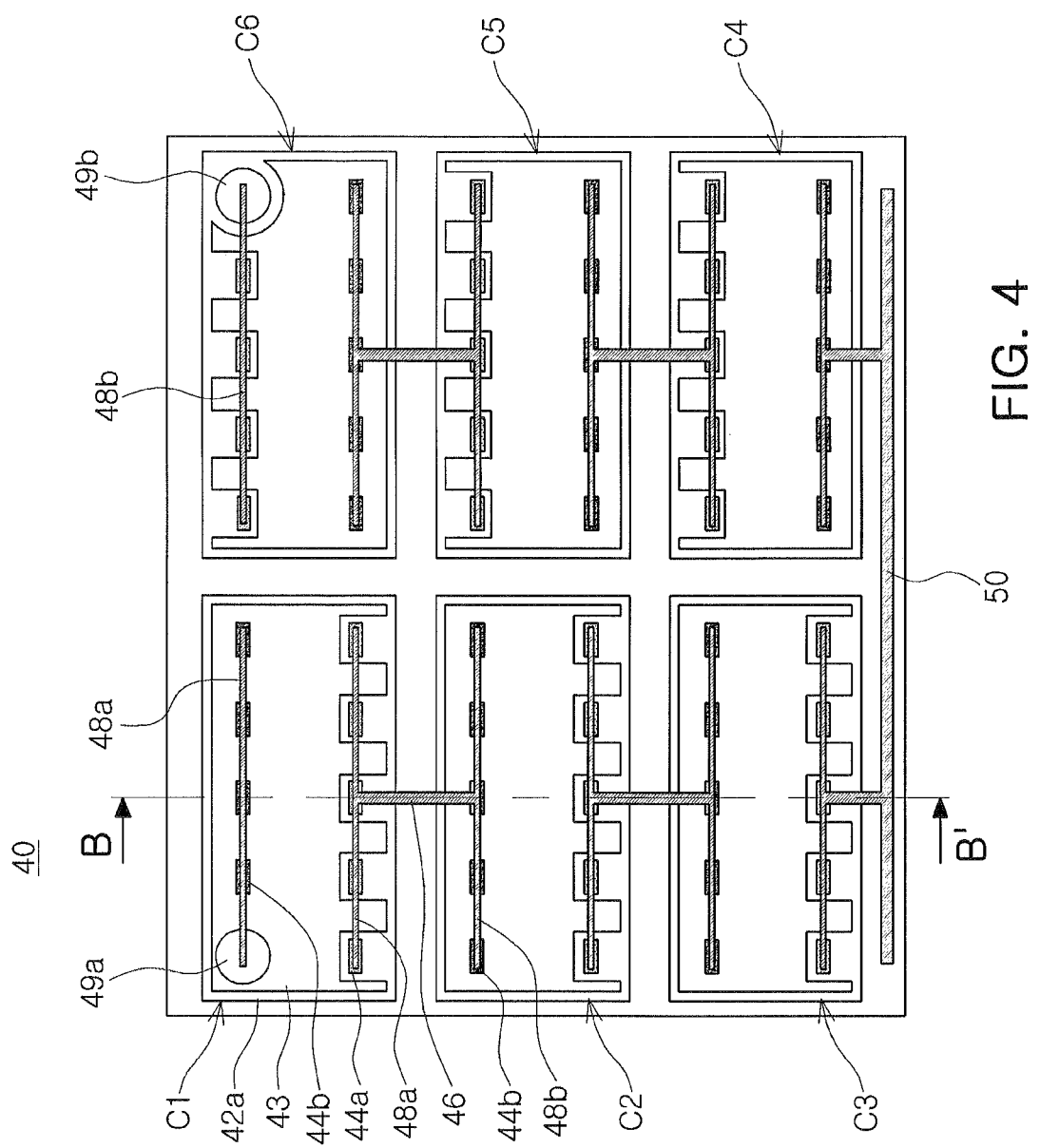
FIG. 4 illustrates a semiconductor light emitting device having a multi-cell array according to an exemplary embodiment of the inventive concept.
Figure 5:
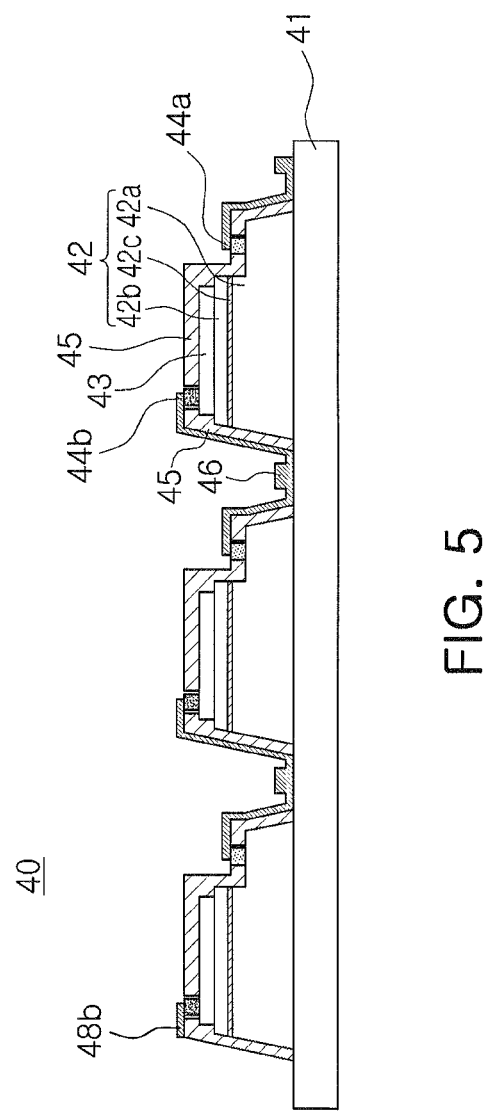
FIG. 5 is a cross-sectional view taken along line B-B' illustrating a connection between cells in the semiconductor light emitting device of FIG. 4.

FIG. 4 illustrates a semiconductor light emitting device having a multi-cell array according to an exemplary embodiment of the inventive concept, and FIG. 5 is a cross-sectional view taken along line B-B' illustrating a connection between cells in the semiconductor light emitting device of FIG. 4.

Figure 2:
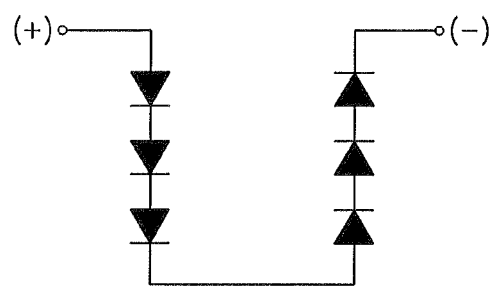
FIG. 2 is an equivalent circuit diagram of the multi-cell array of FIG. 1.

A plurality of light emitting cells C1 to C6 may be formed substantially the same manner as that described in FIGS. 1 to 3. For example, the plurality of light emitting cells C1 to C6 constitutes a daisy chain connection. Multilayer semiconductor films 42 each includes a first semiconductor layer 42a of a first conductivity type impurity, an active layer 42c and a second semiconductor layer 42b of a second conductivity type impurity sequentially formed on an upper surface of the substrate 41. To form multilayer semiconductor films 42, the cell division process and mesa-etching process as explained in FIG. 3 may be used.

First and second electrodes 44a and 44b are disposed on each of the light emitting cells C1 to C6. The first electrodes 44a are connected to an exposed flat surface of a first semiconductor layer 42a of a first conductivity type impurity. The second electrodes 44b are connected to a transparent electrode 43.

Further, as shown in FIG. 4, the first and second connecting units 48a and 48b are formed to connect electrodes having the same polarity to one another. For example, the first connecting unit 48a of the light emitting cell C1 is connected to the second connecting unit 48b of the neighboring light emitting cell C2 through the interconnecting unit 46.

The interconnecting unit 46 is used for the daisy chain connection through the light emitting cells C1 to C6. The interconnecting unit 46 connects the first and second connecting units 48a and 48b having opposite polarities of neighboring light emitting cells C1, C2 and C3.

For example, as shown in FIG. 4, the first connecting unit 48a of the light emitting cell C1 is connected to the second connecting unit 48b of the neighboring light emitting cell C2 using the interconnecting unit 46.

An insulating layer 45 is formed on surfaces of the light emitting cells and prevents the first and second connecting units 48a and 48b and the interconnecting units 46 from making connections with undesired regions of the light emitting cells. However, the insulating layer 45 is omitted in FIG. 4, to clearly show the positional relationships of the plurality of electrodes, the interconnecting units, and the transparent electrodes in the light emitting cells.

The light emitting cells C1 and C6 are positioned at an upper side of the multi-cell array. The light emitting cells C1 and C6 are connected to each other in series in a linear manner. First and second bonding pads 49a and 49b, respectively, are formed on the light emitting cells C1 and C6. The bonding pads 49 and 49b are connected to the electrodes having corresponding polarities. For example, the plurality of electrodes of the light emitting cells C1 and C6 positioned at upper side of the multi-cell array may be connected to the first and second bonding pads 49a and 49b through the first and second connecting units 48a and 48b, respectively.

The bonding pads 49a and 49b, respectively, are disposed on the light emitting cells C1 and C6, positioned at upper side of the multi-cell array, without an intervening electrode of the upper row of electrodes. Alternatively, the light emitting cells C1 and C6 may include two rows of electrodes formed in opposite side of each of the light emitting cells C1 to C6. In such case, the bonding pads 49a and 49b may be formed on one of an upper row of the electrodes.

Here, the first and second bonding pads 49a and 49b may be formed of metals different from those of the first and second connection units 48a and 48b and the interconnection units 46. For example, the first and second bonding pads 49a and 49b may include chromium (Cr), gold (Au), and/or an alloy thereof. The first and second connection units 48a and 48b and the interconnection units 46 for wiring connection may include metals having higher reflectivity and conductivity than metals of the first and second bonding pads. For example, the first and second connection units 48a and 48b and the interconnection units 46 may include Al and/or Ag.

Alternatively, the first and second bonding pads 49a and 49b, the first and second connecting units 48a and 48b and the interconnecting units 46 may be formed by a single metal pattern formation process.

For example, the first and second bonding pads 49a and 49b, the first and second connecting units 48a and 48b and the interconnecting units 46 may include a common metal such as chromium (Cr), gold (Au), and/or an alloy thereof.

The light emitting cells C3 and C4, positioned at one end of two adjacent columns of the multi-cell array among the plurality of light emitting cells C1 to C6, may be connected to each other by a connection line 50 connecting the interconnecting unit 46 of the light emitting cell C3 to the interconnecting unit 46 of the light emitting cell C4.

In this manner, current, which are externally supplied and flows from the first bonding pad 19a to the second bonding pad 19b, spreads uniformly when a plurality of electrodes are formed in the individual light emitting cells. Therefore, the light emitting device 10 has increased light emitting efficiency and increased reliability.

Hereinafter, a semiconductor light emitting device according to an exemplary embodiment of the inventive concept will be described with reference to FIGS. 6 to 8.

Figure 6:
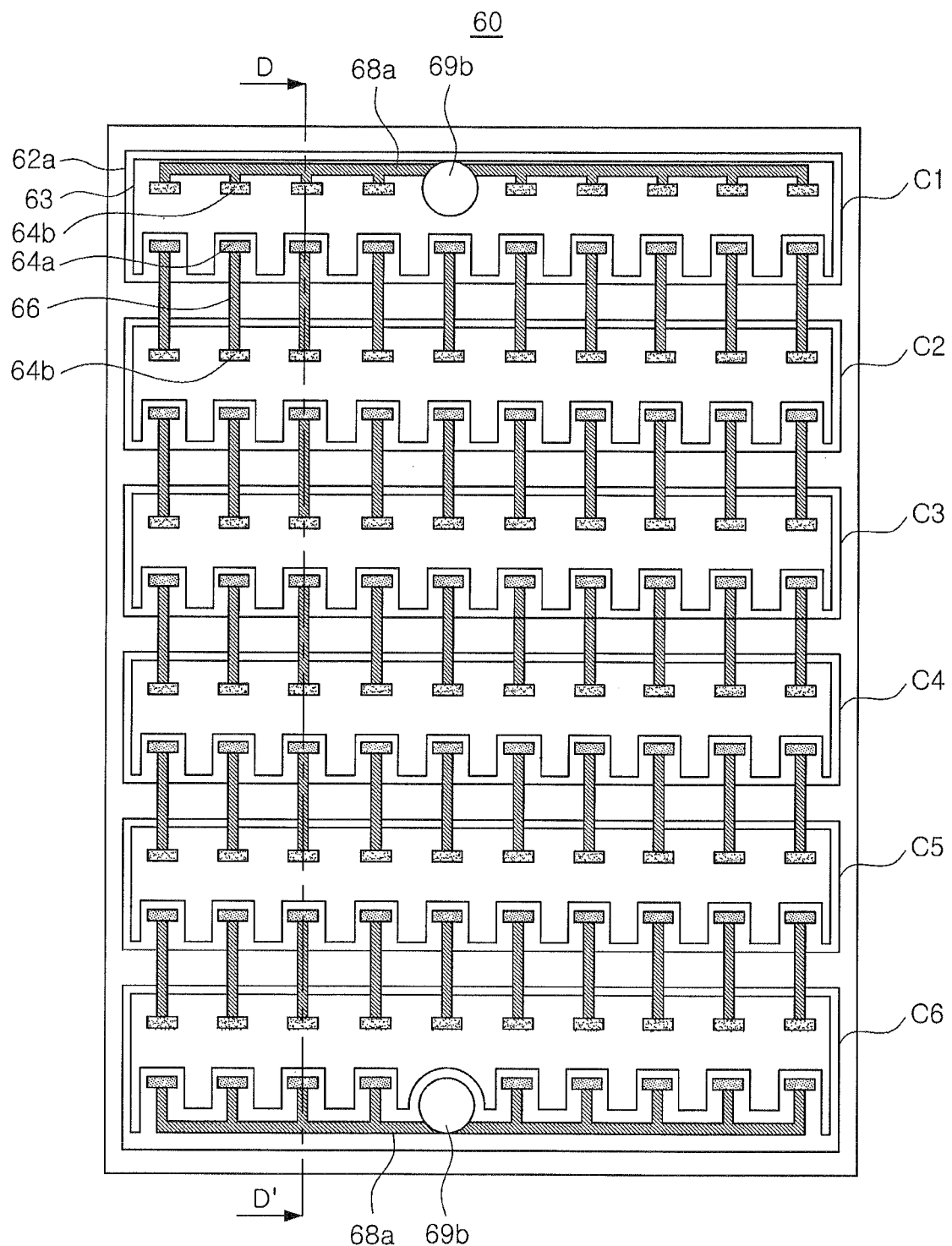
FIG. 6 illustrates a semiconductor light emitting device having a multi-cell array according to an exemplary embodiment of the inventive concept.
Figure 7:
FIG. 7 is an equivalent circuit diagram of the multi-cell array of FIG. 6.

FIG. 6 illustrates a semiconductor light emitting device having a multi-cell array according to an embodiment of the present invention, and FIG. 7 is an equivalent circuit diagram of the multi-cell array embodied in the semiconductor light emitting device of FIG. 6. FIG. 8 is a cross-sectional view taken along line D-D' illustrating a connection between cells in the semiconductor light emitting device of FIG. 7.

A semiconductor light emitting device 60 according to an exemplary embodiment has a substantially similar configuration to that of the semiconductor light emitting device 10, except that a multi-cell array includes a single column of light emitting cells C1 to C6.

As shown in FIG. 6, the semiconductor light emitting device 60 may include a substrate 61 and a plurality of light emitting cells C1 to C6 arranged in a single column. The light emitting cells C1 to C6 are disposed on an upper surface of the substrate 61.

Figure 8:
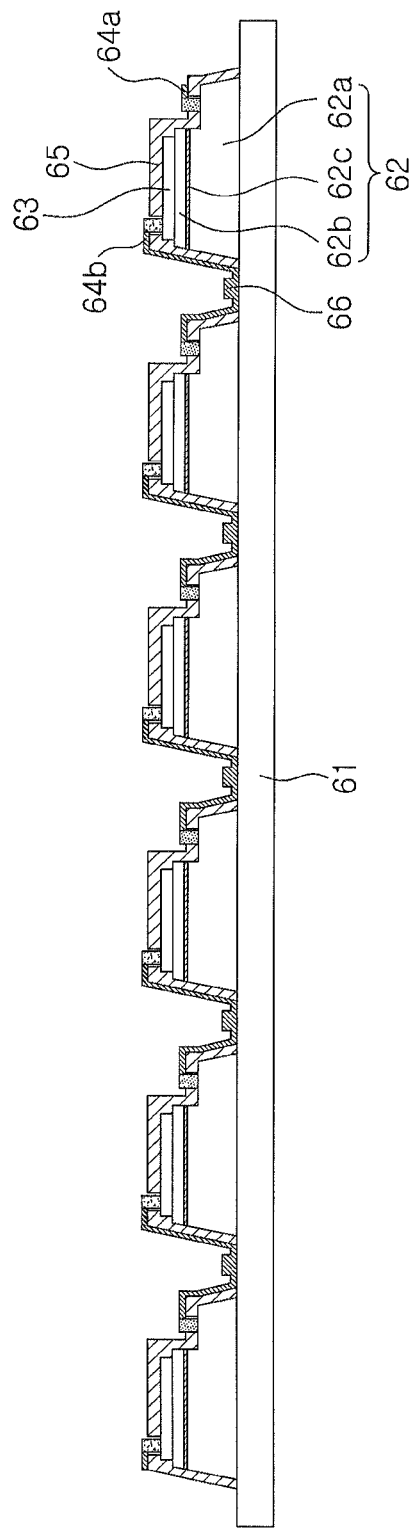
FIG. 8 is a cross-sectional view taken along line D-D' illustrating a connection between cells in the semiconductor light emitting device of FIG. 7.

As shown in FIG. 8, the plurality of light emitting cells C1 to C6 may be formed substantially the same manner as that described in FIGS. 1 to 3, except that the light emitting cells are arranged in a single column. For example, the plurality of light emitting cells C1 to C6 constitutes a daisy chain connection. Multilayer semiconductor films 62 each includes a first semiconductor layer 62a of a first conductivity type impurity, an active layer 62c and a second semiconductor layer 62b of a second conductivity type impurity sequentially formed on an upper surface of the substrate 61. To form multilayer semiconductor films 62, the cell division process and mesa-etching process as explained in FIG. 3 may be used.

The light emitting cells according to an exemplary embodiment may be connected to each other in series in a linear manner, like an equivalent circuit as shown in FIG. 7.

For example, as shown in FIG. 6, the first electrodes 64a of the light emitting cell C1 are connected to the second electrodes 64b of the neighboring light emitting cell C2 using interconnection units 66.

Also, an insulating layer 65 is formed on surfaces of the light emitting cells to insulate the interconnection units 66 from the multilayer semiconductor films 62. For simplicity of explanation, the insulating layer 65 is omitted in FIG. 6.

The light emitting cells C1 and C6, respectively, positioned at either ends of the multi-cell array are provided with first and second bonding pads 69a and 69b, respectively, so as to be connected to the electrodes having corresponding polarities.

For example, the plurality of electrodes of the light emitting cells C1 and C6 positioned at the ends of the multi-cell array is connected to the first and second bonding pads 69a and 69b through the first and second connection units 68a and 68b, respectively.

The bonding pads 69a and 69b, respectively, are disposed on the light emitting cells C1 and C6 without an intervening electrode of the upper row of electrodes. Alternatively, the light emitting cells C1 and C6 may include two rows of electrodes formed in opposite side. In such case, the bonding pads 69a and 69b may be formed on one of an upper row of the electrodes.

The bonding pads 69a and 69b are positioned on the center of the plurality of the first electrodes and the second electrodes disposed on the light emitting cells C1 and C6, respectively.

According to an exemplary embodiment, the light emitting cells are arranged in a single column. Alternatively, the light emitting cells may be arranged in a single row. A distance between the first and second electrodes in the light emitting cells may be minimized to thereby improve power efficiencies of the light emitting device.

As set forth above, according to exemplary embodiments of the inventive concept, a light emitting device has an electrode configuration to uniformly spread current applied and such electrode configuration increases light extraction efficiency and reliability.

While the present inventive concept has been shown and described with reference to exemplary embodiments thereof, it will be apparent to those of ordinary skill in the art that various changes in form and detail may be made therein without departing from the spirit and scope of the inventive concept as defined by the appended claims.

What is claimed is:

1. A semiconductor light emitting device comprising:
a substrate;
a multi-cell array including a plurality of light emitting cells disposed on an upper surface of the substrate,
wherein the plurality of light emitting cells are physically separated from each other and each of the plurality of light emitting cells has a first semiconductor layer having a first conductivity type impurity, an active layer, and a second semiconductor layer having a second conductivity type impurity formed on the upper surface of the substrate, and wherein the first conductivity type impurity has a polarity opposite to that of the second conductivity type impurity;
at least two first electrodes and at least two second electrodes disposed on each of the light emitting cells; and
at least two interconnection units connecting at least two first electrodes disposed on a light emitting cell to at least two second electrodes disposed on a neighboring light emitting cell in series.

2. The semiconductor light emitting device of claim 1, further comprising:
a first connection unit commonly connected to at least two first electrodes of a light emitting cell positioned at one end of the multi-cell array; and
a second connection unit commonly connected to at least two second electrodes of a light emitting cell positioned at other end of the multi-cell array.

3. The semiconductor light emitting device of claim 1, wherein the plurality of light emitting cells are arranged in a plurality of columns arranged in a row direction, wherein each of the plurality of light emitting cells includes two or more light emitting cells arranged in a column direction crossing the row direction, and further comprising a third connection unit connecting light emitting cells positioned at one end of individual columns to each other in a row direction.

4. The semiconductor light emitting device of claim 1, wherein the at least two first electrodes are arranged on one side of a light emitting cell and the at least two second electrodes are arranged on other side, opposite to the one side, of the light emitting cell.

5. The semiconductor light emitting device of claim 1, wherein a number of the at least two first electrodes is identical to a number of the at least two second electrodes.

6. The semiconductor light emitting device of claim 1, wherein the at least two first electrodes are spaced apart at regular intervals, and the at least two second electrodes are spaced apart at regular intervals.

7. The semiconductor light emitting device of claim 1, further comprising an insulating layer disposed between the light emitting cells and the plurality of interconnection units.

8. A semiconductor light emitting device comprising:
  a substrate;
  a multi-cell array including a plurality of light emitting cells disposed on an upper surface of the substrate, wherein the plurality of light emitting cells are physically separated from each other and each of the plurality of light emitting cells has a first semiconductor layer having a first conductivity type impurity, an active layer, and a second semiconductor layer having a second conductivity type impurity, and wherein the first conductivity type impurity has a polarity opposite to that of the second conductivity type impurity;
  at least two first electrodes disposed on the first semiconductor layer of each of the plurality of light emitting cells;
  at least two second electrodes disposed on the second semiconductor layer of each of the plurality of light emitting cells;
  a first connecting unit connecting the at least two first electrodes;
  a second connecting unit connecting the at least two second electrodes; and
  at least two interconnecting units connecting the plurality of light emitting cells in daisy chain connection, wherein each of the at least two interconnecting units connects two adjacent light emitting cells of the plurality of light emitting cells, and each of the at least two interconnecting units connects the first connecting unit disposed on one of the two adjacent light emitting cells and the second connecting unit disposed on other of the two adjacent light emitting cells.

9. The semiconductor light emitting device of claim 8, wherein the plurality of light emitting cells are arranged in a plurality of columns, each of the plurality of columns having two or more light emitting cells, and the interconnecting units include a connection line connecting two adjacent light emitting cells positioned at one end of two adjacent columns, wherein the connection line extends in a row direction.

10. The semiconductor light emitting device of claim 8, wherein the at least two first electrodes and the at least two second electrodes are arranged in opposite to each other.

11. The semiconductor light emitting device of claim 8, further comprising:
  at least one first bonding pad connected to a first connecting unit commonly connecting at least two first electrodes of a light emitting cell positioned at one end of the multi-cell array; and
  at least one second bonding pad connected to a second connecting unit commonly connecting at least two second electrodes of a light emitting cell positioned at the other end of the multi-cell array.

12. The semiconductor light emitting device of claim 8, wherein a number of at least two first electrodes disposed on the one of the two adjacent light emitting cells is identical to a number of at least two second electrodes disposed on the other of the two adjacent light emitting cells.

13. The semiconductor light emitting device of claim 8, wherein the at least two first electrodes are spaced apart at regular intervals, and the at least two second electrodes are spaced apart at regular intervals.

14. The semiconductor light emitting device of claim 8, wherein the plurality of light emitting cells are arranged in a single row or a single column.

15. A semiconductor light emitting device comprising:
  a plurality of light emitting cells physically separated from each other and electrically connected to each other in a daisy chain connection, wherein each of the plurality of light emitting cells includes an active layer for emitting light;
  a first bonding pad disposed on a first light emitting cell of the plurality of light emitting cells, wherein the first light emitting cell is disposed at one end of the daisy chain connection;
  a second bonding pad disposed on a last light emitting cell of the plurality of light emitting cells, wherein the last light emitting cell is disposed at other end of the daisy chain connection;
  a first connection unit disposed on the first light emitting cell and connected to the first bonding pad; and
  a second connection unit disposed on the last light emitting cell and connected to the second bonding pad,
  wherein a bonding pad is not disposed on other light emitting cells except the first light emitting cell and the last light emitting cell.

16. The semiconductor light emitting device of claim 15, wherein the daisy chain connection includes a plurality of metal lines connecting two adjacent light emitting cells of the plurality of light emitting cells.

17. The semiconductor light emitting device of claim 16, wherein the first bonding pad is disposed on a substantially center of the first connection unit.

18. The semiconductor light emitting device of claim 15, wherein each of the plurality of light emitting cells has a first semiconductor layer having a first conductivity type impurity, an active layer, and a second semiconductor layer having a second conductivity type impurity, and wherein the first conductivity type impurity has a polarity opposite to that of the second conductivity type impurity.

19. The semiconductor light emitting device of claim 16, further comprising an insulating layer disposed between the plurality of metal lines and the first light emitting cell.

20. The semiconductor light emitting device of claim 15, wherein the plurality of light emitting cells are arranged in a single row or a single column.

* * * * *